(12) United States Patent
Sugibayashi et al.

(10) Patent No.: US 8,225,659 B2
(45) Date of Patent: Jul. 24, 2012

(54) VIBRATING GYRO

(75) Inventors: Hideaki Sugibayashi, Toyama (JP); Keiichi Okano, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 461 days.

(21) Appl. No.: 12/540,387

(22) Filed: Aug. 13, 2009

(65) Prior Publication Data

US 2010/0058862 A1    Mar. 11, 2010

(30) Foreign Application Priority Data

Sep. 8, 2008   (JP) ................................. 2008-229780

(51) Int. Cl.
  *G01P 9/04*   (2006.01)
(52) U.S. Cl. .................................................. 73/504.12
(58) Field of Classification Search ............... 73/504.12, 73/504.04, 504.02, 504.15, 504.16
  See application file for complete search history.

(56) References Cited

U.S. PATENT DOCUMENTS

| | | | | |
|---|---|---|---|---|
| 5,321,761 | A * | 6/1994 | Kitanishi | 381/190 |
| 5,874,674 | A * | 2/1999 | Kasanami et al. | 73/504.14 |
| 6,116,086 | A * | 9/2000 | Fujimoto | 73/504.14 |
| 6,467,347 | B1 * | 10/2002 | Fujimoto | 73/504.12 |
| 6,564,638 | B1 * | 5/2003 | Ebara | 73/504.14 |
| 6,566,790 | B1 * | 5/2003 | Serita | 310/328 |
| 6,584,842 | B2 * | 7/2003 | Fujimoto et al. | 73/504.12 |
| 6,770,956 | B2 * | 8/2004 | Fujimoto et al. | 257/659 |
| 6,907,783 | B2 * | 6/2005 | Fujimoto | 73/504.14 |
| 7,401,516 | B2 * | 7/2008 | Inaguma et al. | 73/504.15 |
| 7,779,687 | B2 * | 8/2010 | Murashima | 73/504.12 |
| 7,845,227 | B2 * | 12/2010 | Fukuzawa | 73/504.12 |
| 8,001,840 | B2 * | 8/2011 | Kurihara | 73/504.12 |
| 2002/0167063 | A1 | 11/2002 | Fujimoto et al. | |

FOREIGN PATENT DOCUMENTS

| | | |
|---|---|---|
| JP | 2000-205861 A | 7/2000 |
| JP | 2003-028649 A | 1/2003 |
| JP | 3396767 B2 | 4/2003 |
| WO | 2006/075545 A1 | 7/2006 |

OTHER PUBLICATIONS

"I2C Bus Control Compatible AGC Built-In Stereo BTL Amplifier IC (for Driving a Piezoelectric Speaker)," Panasonic Data Sheet AN12959A, Oct. 2008, pp. 1-27.

* cited by examiner

*Primary Examiner* — Helen C. Kwok
(74) *Attorney, Agent, or Firm* — Keating & Bennett, LLP (57) ABSTRACT

A piezoelectric vibrator of a vibration gyro vibrates in response to a drive voltage $V_{drv}$ input into a drive electrode, and when deformed by a Coriolis force, generates detection voltages $V_{agc}$, between which a potential difference corresponds to the deformation, at detection electrodes. An AGC circuit outputs a drive voltage $V_{drv}$ while performing automatic gain control so that the detection voltages $V_{agc}$ have a given amplitude. A phase inversion circuit and a BTL amplifier circuit output a BTL voltage $V_{btl}$, whose phase is opposite to the detection voltage $V_{agc}$ and whose amplitude has been increased, to the detection electrodes via detection resistances. The AGC circuit reduces the detection voltages $V_{agc}$ in order to prevent the drive voltage $V_{drv}$ from exceeding a design upper limit value $V'_{drv}$.

5 Claims, 7 Drawing Sheets

VIBRATING GYRO

BACKGROUND OF THE INVENTION

1. Field of the Invention

The present invention relates to a vibration gyro that detects an angular velocity using a Coriolis force.

2. Description of the Related Art

For example, a digital video camera or a digital still camera detects an angular velocity using a vibration gyro in order to correct a hand motion (see, for example, see Japanese Unexamined Patent Application Publication No. 2000-205861).

Figure 1:
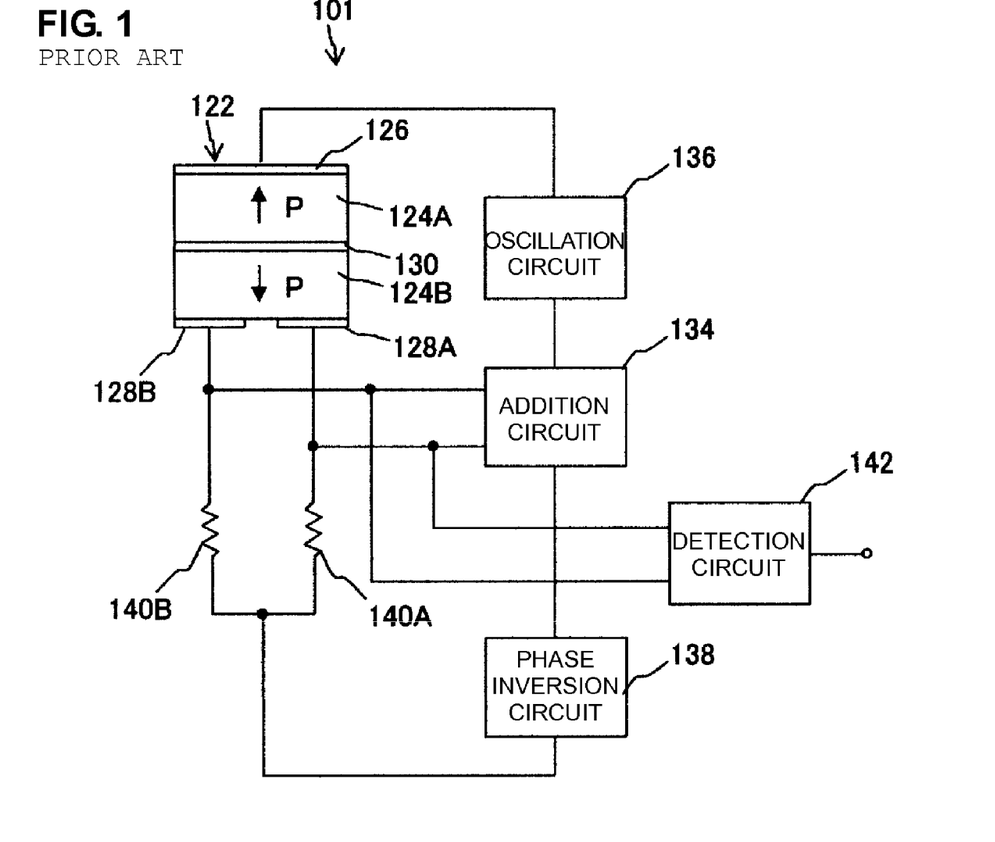
FIG. 1 is a block diagram showing an example of a related-art vibration gyro.

FIG. 1 is a drawing showing an example of a related-art vibration gyro.

A vibration gyro 101 includes a piezoelectric vibrator 122, an addition circuit 134, an oscillation circuit 136, a detection circuit 142, and a phase inversion circuit 138.

The piezoelectric vibrator 122 is a pillar-shaped vibrator. FIG. 1 shows a section of the pillar. The piezoelectric vibrator 122 includes a drive electrode 126, detection electrodes 128A and 128B, an intermediate electrode 130, and piezoelectric bodies 124A and 124B. The intermediate electrode 130 is interposed between the piezoelectric bodies 124A and 124B. The piezoelectric bodies 124A and 124B are polarized in the directions of arrow P in FIG. 1. In the piezoelectric vibrator 122, the piezoelectric bodies 124A and 124B expand or contract in directions perpendicular to the surface of FIG. 1 on the basis of a sinusoidal drive voltage applied to the drive electrode 126 by the oscillation circuit 136. Since the piezoelectric bodies 124A and 124B expand or contract in opposite directions, the entire piezoelectric vibrator 122 bends and vibrates vertically. When an angular velocity is applied to the piezoelectric vibrator 122 due to a hand motion or other external force, the piezoelectric vibrator 122 becomes deformed due to a Coriolis force in a direction perpendicular to the vibration direction (e.g., vertically). In the piezoelectric vibrator 122, a potential difference corresponding to this deformation occurs between the detection electrodes 128A and 128B.

The addition circuit 134 adds and averages detection voltages of the detection electrodes 128A and 128B and outputs the resultant voltage. The oscillation circuit 136 outputs a drive voltage. The detection circuit 142 detects an electromotive voltage due to a piezoelectric effect from the potential difference between the detection voltages of the detection electrodes 128A and 128B. The phase inversion circuit 138 inverts the phase of a voltage output from the addition circuit 134 and outputs the resultant voltage to the detection electrodes 128A and 128B via detection resistances.

In the above-described configuration of the vibration gyro, the detection voltages detected by the detection electrodes 128A and 128B are voltages obtained by dividing the drive voltage using a voltage divider circuit including a drive resonant resistance of the piezoelectric vibrator 122 and the detection resistances 140A and 140B. As shown in the following formula, the drive voltage and detection voltages are proportional to each other:

$$V = \frac{V_{drv} \times R_k}{2 \times Z + R_k}$$

where V [Vpp] is the amplitude of the detection voltage, $V_{drv}$ [Vpp] is the amplitude of the drive voltage, $R_k$ [Ω] is the detection resistance (including two parallel resistances) and Z [Ω] is the drive resonant resistance of the piezoelectric vibration unit.

This proportionality factor is a positive value less than 1. Therefore, in the vibration gyro 101, a both-end voltage ($V_{drv}$–V) of the piezoelectric vibrator is increased as the drive voltage $V_{drv}$ or detection voltage V is increased. Conversely, the both-end voltage ($V_{drv}$–V) of the piezoelectric vibrator is reduced as the drive voltage $V_{drv}$ or detection voltage V is reduced. Therefore, in order to increase the mechanical drive amplitude or sensitivity of the vibration gyro 101, both the drive voltage $V_{drv}$ and the detection voltage V must be increased.

Generally, when a piezoelectric vibrator is separately excited by an oscillation circuit in a vibration gyro, the oscillation frequency may deviate from the resonance point of the piezoelectric vibrator. For this reason, matching the oscillation frequency with the resonance point of the piezoelectric vibrator by providing an automatic gain control (AGC) circuit and a phase-shift circuit and causing the piezoelectric vibrator to excite itself using these circuits as been considered. In this case, the AGC circuit outputs a drive voltage subjected to automatic gain control so that an output voltage of the addition circuit has a given amplitude. The phase-shift circuit controls the phase of the drive voltage so that the piezoelectric vibrator excites itself.

In a configuration including the AGC circuit, if the amplitude of the drive voltage is too large, the drive voltage deviates from the dynamic range of the AGC circuit and then is clipped. Thus, a problem such as an oscillation stop occurs. For this reason, the drive voltage must be set so that it falls within the dynamic range of the AGC circuit. In addition, recently, vibration gyros have been required to reduce an input power supply voltage provided from the set that includes the gyros. Therefore, in order to confine the drive voltage within the dynamic rage of the AGC circuit, the drive voltage must be further reduced.

For example, in order to reduce the input power supply voltage to Vcc=2.6 V, it is necessary to reduce the amplitude of the drive voltage to 2.0 Vpp or less while considering the transistor saturation voltage of a drive amplifier of the AGC circuit. If the amplitude of the drive voltage is reduced, the both-end voltage or the mechanical vibration amplitude of the piezoelectric vibrator is also reduced. As a result, it is difficult to obtain high-sensitivity gyro characteristics.

SUMMARY OF THE INVENTION

To overcome the problems described above, preferred embodiments of the present invention provide a vibration gyro that can obtain high-sensitivity gyro characteristics even if an input power supply voltage is reduced.

A vibration gyro according to a preferred embodiment of the present invention includes a piezoelectric vibration unit, an addition circuit, an automatic gain control circuit, a balanced transformerless (BTL) circuit, and a detection circuit. The piezoelectric vibration unit includes a drive electrode and first and second electrodes, vibrates on the basis of a drive voltage input into the drive electrode, and when deformed by a Coriolis force, generates detection voltages, between which a potential difference corresponding to the deformation is produced, at the first and substrate detection electrodes. The addition circuit adds the detection voltages of the first and second detection electrodes. The AGC circuit outputs a drive voltage while performing automatic gain control so that an output voltage of the addition circuit has a given amplitude. The BTL circuit outputs a voltage preferably having an amplitude greater than that of the detection voltages to the first and second detection electrodes via a detection resistance in a phase obtained by inverting an output voltage of the addition circuit. The detection circuit detects the potential difference from the detection voltages of the first and second detection electrodes. A circuit constant of the automatic gain control circuit is preferably set so that an amplitude $V_{agc}$ of each of the detection voltages preferably satisfies Formula 1 below.

$$V_{agc} < \frac{V'_{drv} \times R_k}{2 \times Z + R_k} \quad \text{Formula 1}$$

In this configuration, a voltage (hereafter referred to as a "BTL voltage") whose phase has been inverted more significantly than that of the detection voltage is output to one end of the detection resistance and the drive voltage is output to one end of the piezoelectric vibration unit. Therefore, the detection voltage at the contact between the piezoelectric vibration unit and detection resistance is a voltage obtained by dividing the drive voltage and BTL voltage in accordance with the resistance ratio between the drive resonant resistance of the piezoelectric vibration unit and the detection resistance, and BTL voltage. Thus, the detection voltage is subjected to automatic gain control by the automatic gain control circuit (AGC circuit) so that the detection voltage has a given amplitude.

The right side of Formula 1 represents the amplitude of a detection voltage wherein, when the BTL gain, which is the amplification rate of the BTL voltage to the detection voltage, is about one, the drive voltage defines the design upper limit value $V'_{drv}$. In this configuration, the amplitude of the BTL voltage is preferably set to be greater than the detection voltage, so the BTL gain is greater than about one. Therefore, the above formula indicates that when the BTL gain is about one, automatic gain control is performed so that the amplitude of the actual detection voltage is less than the amplitude of the detection voltage where the drive voltage is the design upper limit value, and thus, a reduced power supply voltage is achieved.

Even if the amplitude of the actual detection voltage is reduced, the BTL voltage achieved with this configuration is a voltage obtained by inverting the phase with an amplitude greater than that of the detection voltage. Therefore, the both-end voltage of the detection voltage is greater than that in a case where the BTL gain is one. Throughout the present application, "both-end voltage" means the potential difference between the two ends of a component. Since the resistance ratio between the drive resonant resistance of the piezoelectric vibration unit and the detection resistance is preferably constant, the both-end voltage of the piezoelectric vibration unit is greater than that where the BTL gain is one. Therefore, even if the drive voltage is set to a drive voltage in accordance with a reduced power supply voltage, the both-end voltage of the piezoelectric vibration unit is increased. Thus, the mechanical vibration amplitude of the piezoelectric vibration unit is increased.

In this case, the design upper limit value $V'_{drv}$ of the drive voltage preferably satisfies Formula 2 below.

$$V'_{drv} = A_{drv} \times (V_{CC} - V_{sat}) \quad \text{Formula 2}$$

In this configuration, even when the drive voltage varies due to a temperature variation based on the temperature characteristics of the piezoelectric vibration unit, it is possible to maintain the drive voltage within the range of temperature variations in a voltage range less than the power supply voltage in view of the drive amplifier saturation voltage of the automatic gain control circuit. Thus, an oscillation stop or clamp of the drive wavelength is prevented.

For the BLT circuit, the voltage amplitude is preferably amplified so that a gain $G_b$ of an output voltage with respect to the detection voltage preferably satisfies Formula 3 below.

$$G_b \leq \frac{R_k}{Z} \times \left(\frac{V'_{drv}}{V_{agc}} - 1\right) - 1 \quad \text{Formula 3}$$

Thus, even if the amplitude of the detection voltage $V_{agc}$ subjected to automatic gain control by the AGC circuit is any amplitude, the drive voltage $V_{drv}$ will not exceed the design upper limit value. In addition, the BTL gain is greater than one, such that the both-end voltage of the piezoelectric vibration unit is increased. Thus, the mechanical vibration amplitude of the piezoelectric vibration unit is increased.

In this case, the gain $G_b$ preferably satisfies Formula 4 below.

$$G_b \cong \frac{R_k}{Z} \times \left(\frac{V'_{drv}}{V_{agc}} - 1\right) - 1 \quad \text{Formula 4}$$

Thus, even if the amplitude value of the detection voltage $V_{agc}$ subjected to automatic gain control by the AGC circuit is any amplitude value, it is possible to maximize the both-end voltage of the piezoelectric vibration unit and maximize the mechanical vibration amplitude of the piezoelectric vibration unit while preferably making the drive voltage $V_{drv}$ approximately equal to the design upper limit value.

The automatic gain control circuit preferably includes a time constant circuit that smoothes an output voltage of the addition circuit, and a circuit constant of the automatic gain control circuit is preferably set so that an amplitude of an output voltage of the addition circuit is greater than an amplitude that causes a smoothing error in the time constant circuit. While the time constant circuit including a capacitor to smooth an output voltage of the addition circuit is used in the automatic gain control circuit, it is preferable to set the amplitude of the detection voltage so that no smoothing error occurs in the time constant circuit.

According to a preferred embodiment of the present invention, the BLT gain is increased while reducing the amplitude of the detection voltage so as to reduce the power supply voltage. Thus, the mechanical vibration amplitude of the piezoelectric vibration unit is greater than that of the related-art example. Therefore, the sensitivity of the vibration gyro is increased.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENT

A vibration gyro 1 according to a preferred embodiment of the present invention will be described with reference to the drawings.

Figure 2:
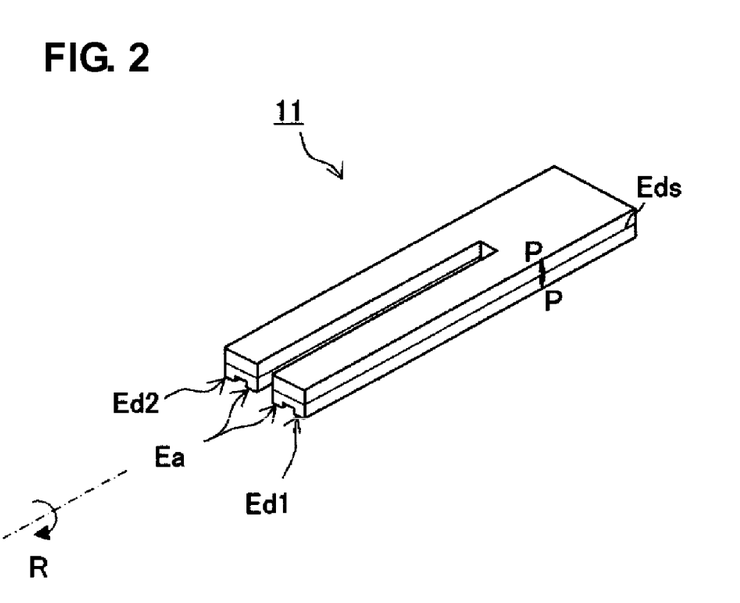
FIG. 2 is a perspective view showing an example of a piezoelectric vibrator of a vibration gyro according to a preferred embodiment of the present invention.

FIG. 2 is a perspective view of a piezoelectric vibrator 11 included in the vibration gyro 1. The piezoelectric vibrator 11 is preferably formed by bonding together two piezoelectric substrates subjected to a polarization process such that the polarization directions are opposite to one another and then forming the bonded piezoelectric substrates into a tuning fork. A pair of legs of the piezoelectric vibrator 11 are provided with a drive electrode Ea, and detection electrodes Ed1 and Ed2 on a lower portion thereof as shown in FIG. 2. An intermediate metal film Eds is interposed between the bonded surfaces. When a drive voltage is applied between the drive electrode Ea and detection electrodes Ed1 and Ed2, the pair of legs of the piezoelectric vibrator 11 make basic vibrations in left-right open-close directions.

When an angular velocity is applied to the piezoelectric vibrator 11 in an R direction shown in FIG. 2, the pair of legs of the piezoelectric vibrator 11 are deformed by a Coriolis force in opposite vertical directions as shown in FIG. 2. A metal film may preferably be provided on a surface of the piezoelectric vibrator 11 opposed to the surface thereof on which the electrodes Ed1, Ed2, and Ea are provided.

Figure 3:
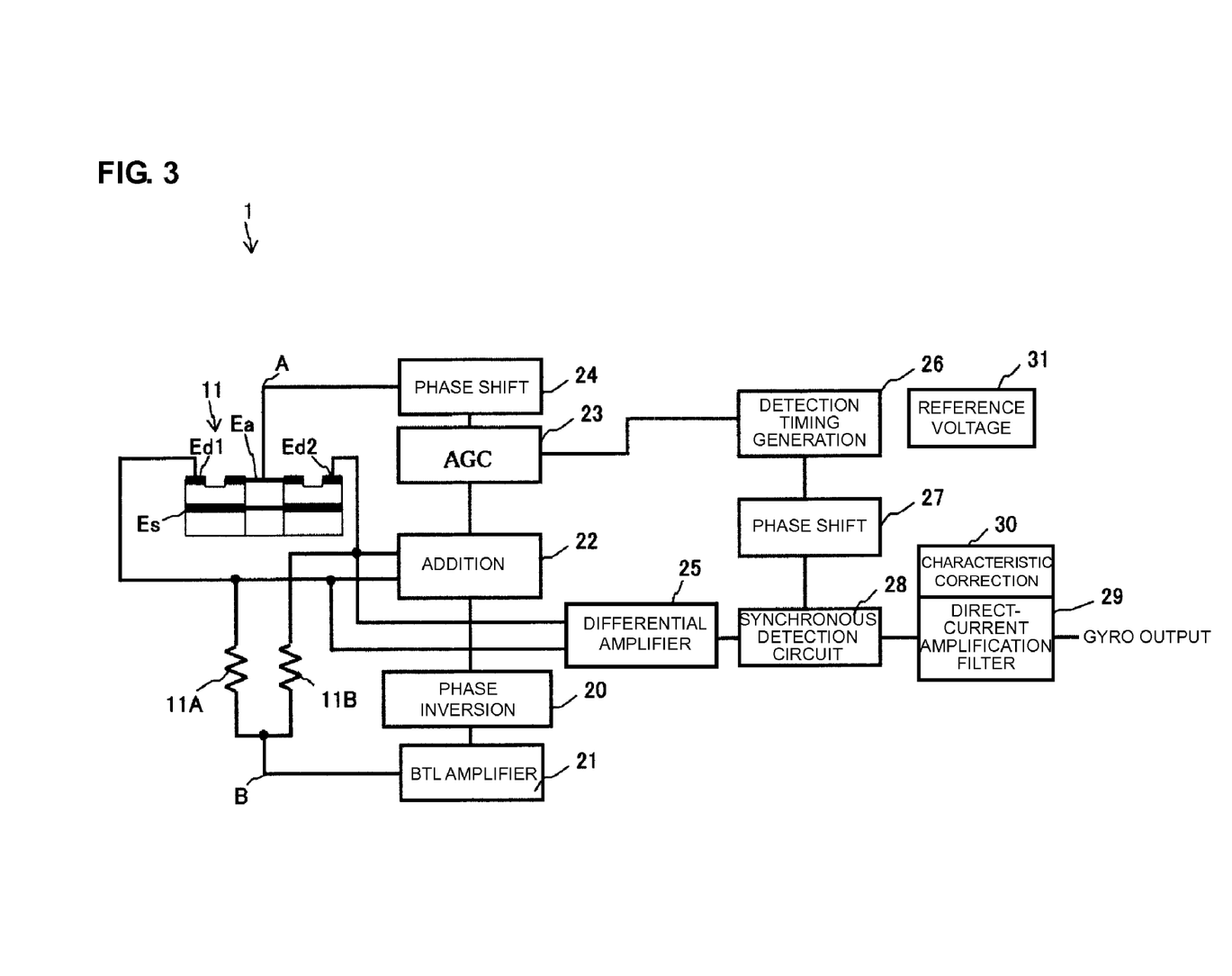
FIG. 3 is a block diagram showing an example configuration of the vibration gyro according to a preferred embodiment of the present invention.

FIG. 3 is a block diagram of the vibration gyro 1.

The vibration gyro 1 includes the piezoelectric vibrator 11, detection resistances 11A and 11B, an addition circuit 22, a phase inversion circuit 20, a BTL amplifier circuit 21, an automatic gain control circuit (AGC circuit) 23, a phase-shift circuit 24, a differential amplifier circuit 25, a detection timing generation circuit 26, a phase-shift circuit 27, a synchronous detection circuit 28, a direct-current amplifier filter 29, a characteristic correction circuit 30, and a reference voltage circuit 31.

The reference voltage circuit 31 generates input power supply voltages required for the circuits and provides the generated input power supply voltages thereto.

The piezoelectric vibrator 11 includes the drive electrode Ea, the detection electrodes Ed1 and Ed2, and an intermediate metal film Es. The intermediate metal film Es is disposed inside the piezoelectric vibrator 11 in a direction perpendicular or substantially perpendicular to the thickness direction without being connected to any circuit. When the piezoelectric vibrator 11 is deformed by a Coriolis force, electromotive voltages having opposite polarities occur between the intermediate metal film Es and detection electrode Ed1 and between the intermediate metal film Es and detection electrode Ed2.

The addition circuit 22 adds and averages detection voltages detected by the detection electrodes Ed1 and Ed2 of the piezoelectric vibrator 11. Unless no angular velocity is applied to the piezoelectric vibrator, the detection voltages are added and averaged so that the detection voltages and the resultant voltage preferably have the same or substantially the same amplitude $V_{agc}$.

The AGC circuit 23 compares the averaged voltage with a predetermined amplitude and outputs a drive voltage $V_{drv}$, where a loop gain is controlled, so that the detection voltage $V_{agc}$ has a given amplitude. The detection voltage $V_{agc}$ may be arbitrarily set as a predetermined amplitude based on the setting of a circuit constant of the AGC circuit 23.

The phase-shift circuit 24 controls the phase of the drive voltage $V_{drv}$ [Vpp] so that an oscillation operation is performed in a loop including the addition circuit 22, AGC circuit 23, phase-shift circuit 24, and piezoelectric vibrator 11, and outputs the resultant drive voltage to the piezoelectric vibrator 11. Thus, self-excitation oscillation using the resonant frequency unique to the piezoelectric vibrator 11 as the oscillation frequency occurs in the oscillation loop including the piezoelectric vibrator 11, addition circuit 22, AGC circuit 23, and phase-shift circuit 24.

The phase inversion circuit 20 preferably inverts the phase of an output voltage $V_{agc}$ of the addition circuit 22 by about 180 degrees, for example. The BTL amplifier circuit 21 amplifies an output voltage of the phase inversion circuit 20 by BTL gain Gb times and outputs the resultant voltage to terminals of the detection resistances 11A and 11B as a BTL voltage $V_{btl}$ [Vpp]. The phase inversion circuit 20 and BTL amplifier circuit 21 preferably define a BTL circuit according to this preferred embodiment. The BTL voltage $B_{btl}$ is obtained by inversion-amplifying the detection voltage $V_{agc}$ by the gain Gb times and is preferably represented by the following formula.

$$V_{btl} = -V_{agc} \times G_b \qquad \text{Formula 6}$$

The BTL voltage $V_{btl}$ may preferably be arbitrarily set as a predetermined amplitude based on the setting of the BTL gain Gb.

When the drive voltage $V_{drv}$ is applied to the drive electrode Ea of the piezoelectric vibrator 11, the piezoelectric vibrator 11 vibrates in an open/close manner, as described above. When an angular velocity occurs around a detection axis of the piezoelectric vibrator 11, the piezoelectric vibrator 11 is deformed by a Coriolis force, and thus, the detection voltages $V_{agc}$ of the detection electrodes Ed1 and Ed2 are changed in opposite directions. As a result, a potential difference occurs between the two detection electrodes Ed1 and Ed2.

The differential amplifier circuit 25 differential-amplifies the potential difference between the detection electrodes Ed1 and Ed2 to obtain an electromotive voltage signal. The synchronous detection circuit 28 detects the differential-amplified electromotive voltage signal in synchronization with the oscillation cycle of the oscillation frequency. The detection timing generation circuit 26 receives an oscillation signal taken from the input or output of the AGC circuit 23 to generate a reference phase signal for synchronous detection. The phase-shift circuit 27 shifts the phase of this reference phase signal to an extent necessary for synchronous detection and provides the resultant reference phase signal to the synchronous detection circuit 28 as the final reference phase signal for synchronous detection. The direct-current amplifier filter 29 direct-current-amplifies a voltage output from the synchronous detection circuit 28 and outputs the resultant voltage signal. This voltage is preferably a voltage signal that is proportional to the angular velocity around the detection axis of the piezoelectric vibrator 11. The characteristic correction circuit 30 corrects a gain and an offset of the direct-current amplifier filter 29 to correct characteristics (characteristic curve) of the output voltage with respect to the angular velocity, such as a gain, an offset, and a temperature characteristic. The differential amplifier circuit 25, synchronous detection circuit 28, detection timing generation circuit 26, phase-shift circuit 27, direct-current amplifier filter 29, and characteristic correction circuit 30 define a detection circuit according to this preferred embodiment.

Figure 4A:
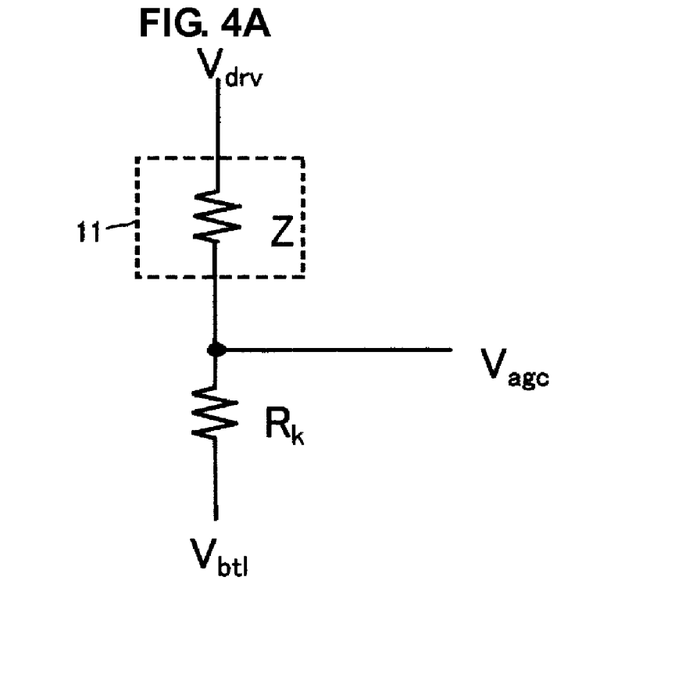
FIGS. 4A and 4B are equivalent circuit diagrams around the piezoelectric vibrator of the vibration gyro according to a preferred embodiment of the present invention.

Hereafter, the relationship among the detection voltage $V_{agc}$, drive voltage $V_{drv}$, and BTL voltage $V_{btl}$ will be described. The detection voltage $V_{agc}$ is a voltage obtained by dividing the drive voltage $V_{drv}$ and BTL voltage $V_{btl}$ in accordance with the resistance ratio between the drive resonant resistance Z [Ω] of the piezoelectric vibrator 11 and the detection resistance (corresponding to two parallel resistances) $R_k$ [Q] of the detection resistances 11A and 11B. FIG. 4A shows a circuit diagram of a voltage divider circuit defined by the piezoelectric vibrator 11 and detection resistances 11A and 11B.

A both-end voltage $V_r$ [Vpp] of the detection resistance is a difference voltage between the BTL voltage $V_{btl}$ and detection voltage $V_{agc}$ and is preferably represented by the following formula.

$$V_r = V_{agc} - V_{btl} = V_{agc} - (-V_{agc} \times G_b) = V_{agc} \times (1+G_b) \quad \text{Formula 7}$$

Therefore, as the BTL gain $G_b$ is increased and the amplitude of the BTL voltage $V_{btl}$ is increased, the both-end voltage $V_r$ of the detection resistances 11A and 11B has a relatively large voltage amplitude as compared to the detection voltage $V_{agc}$.

Figure 4B:
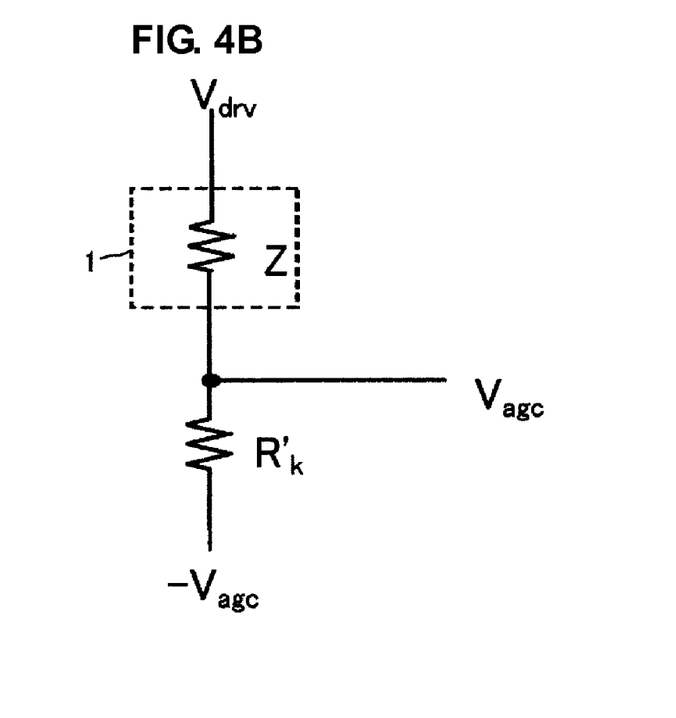

Since a voltage having an amplitude that is 1+Gb times the AGC voltage is applied to both of the ends of the detection resistances 11A and 11B, this voltage divider circuit can be considered as an equivalent voltage divider circuit that divides the phase inversion voltage of the detection voltage $V_{agc}$ using an equivalent detection resistance value that is reduced by providing the BTL circuit. FIG. 4B shows a circuit diagram of this equivalent voltage divider circuit. An equivalent resistance value $R'_k$ is preferably represented by the following.

$$R'_k = \frac{1}{1+G_b} \times R_k \quad \text{Formula 8}$$

The drive voltage $V_{drv}$ is preferably represented by the following formula based on the drive resonant resistance Z of the piezoelectric vibrator 11 and the equivalent detection resistance value $R'_k$.

$$V_{drv} = \frac{V_{agc} \times (Z + R'_k)}{R'_k} = V_{agc} \times \left(\frac{Z}{R'_k} + 1\right) \quad \text{Formula 9}$$

A both-end voltage Vs [Vpp] of the piezoelectric vibrator 11 is a difference voltage between the drive voltage $V_{drv}$ and the detection voltage $V_{agc}$ and is preferably represented by the following formula.

$$V_s = V_{drv} - V_{agc} = V_{agc} \times \frac{Z}{R'_k} \quad \text{Formula 10}$$

Therefore, under a condition in which the detection voltage $V_{agc}$ is constant, the equivalent detection resistance $R'_k$ is reduced as the gain $G_b$ is increased. In addition, the drive voltage $V_{drv}$ and the both-end voltage $V_s$ of the piezoelectric vibrator 11 have relatively large amplitudes as compared to the detection voltage $V_{agc}$.

As shown in FIG. 4B, the drive voltage $V_{drv}$ is determined by the combination of the BTL voltage $V_{btl}$ and detection voltage $V_{agc}$. Also, the both-end voltage $V_s$ of the piezoelectric vibrator 11 or the equivalent detection resistance $R'_k$ of the detection resistances 11A and 11B is determined by the combination of the drive voltage $V_{drv}$, BTL voltage $V_{btl}$, and detection voltage $V_{agc}$.

Next, advantages of preferred embodiments of the present invention will be described based on an example configuration in which the resistance ratio of the voltage divider circuit is predetermined. Hereafter, a case in which the BTL voltage is not amplified, that is, the BTL gain $G_b$=about 1.0 and a case in which the BTL voltage is amplified with the BTL gain $G_b$=about 2.5 will be compared.

However, in these cases, the same piezoelectric vibrator 11 and detection resistances 11A and 11B are used. Also, different detection voltages $V_{agc}$ and BTL gains $G_b$ are used so that approximately the same drive voltage $V_{drv}$ can be achieved in both the case in which the BTL gain $G_b$=about 2.5 and the case in which BTL gain $G_b$=1.

Figure 5A:
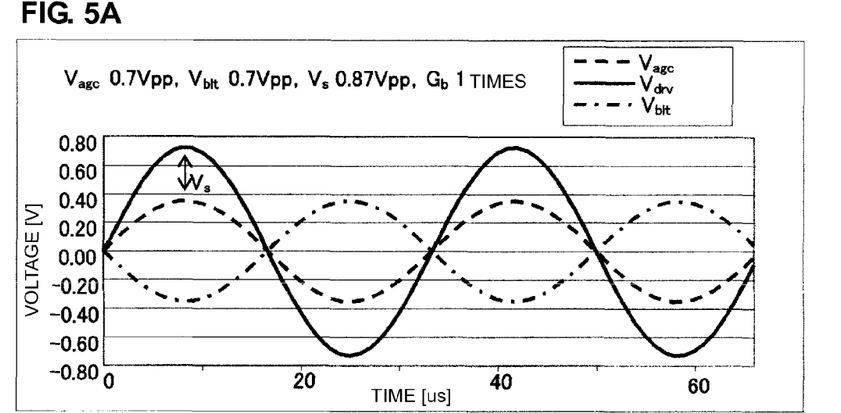
FIGS. 5A to 5C are graphs showing a comparison between a case in which the BTL gain Gb=1 and a case in which the BTL gain Gb=2.5.
Figure 5B:
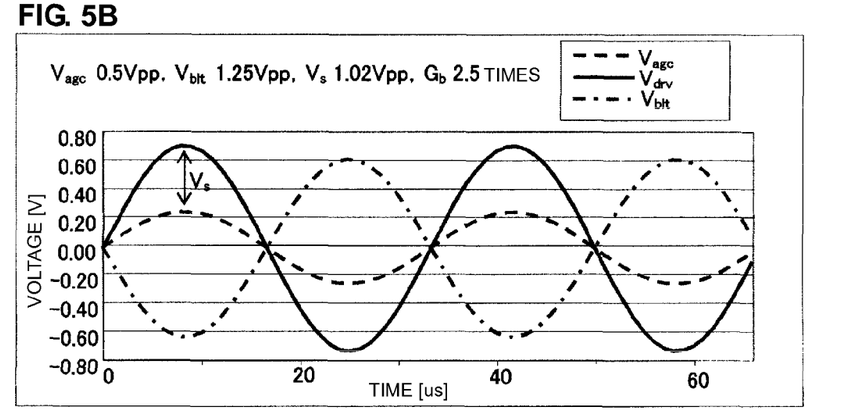
Figure 5C:
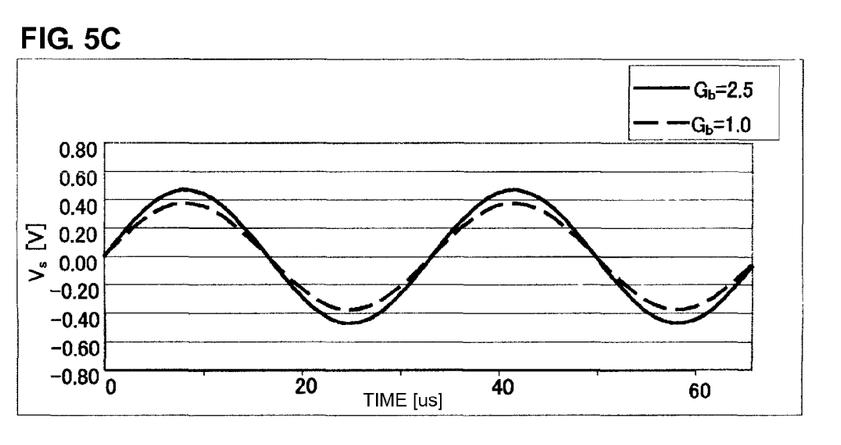

FIG. 5A is a graph showing the relationships among the detection voltage $V_{agc}$, drive voltage $V_{drv}$, and BTL voltage $V_{btl}$ when the BTL gain $G_b$=about 1. FIG. 5B is a graph showing the relationships among the detection voltage $V_{agc}$, drive voltage $V_{drv}$, and BTL voltage $V_{btl}$ when the BTL gain $G_b$=about 2.5. FIG. 5C is a graph showing the relationship between the both-end voltage $V_s$ of the piezoelectric vibrator when the BTL gain $G_b$=about 1 and that when the BTL gain $G_b$=about 2.5.

Where $G_b$=about 1.0, the detection voltage $V_{agc}$ is set to about 0.7 Vpp. In this case, the BTL voltage $V_{btl}$ was about 0.7 Vpp and the both-end voltage $V_s$ of the piezoelectric vibrator 11 was about 0.87 Vpp.

On the other hand, when $G_b$=about 2.5, the detection voltage $V_{agc}$ is set to about 0.5 Vpp so that the drive voltage $V_{drv}$ is preferably substantially the same as that when BTL gain $G_b$=about 0. In this case, the BTL voltage $V_{btl}$ was about 1.25 Vpp and the both-end voltage $V_s$ of the piezoelectric vibrator 11 was about 1.02 Vpp. That is, the both-end voltage $V_s$ of the piezoelectric vibrator 11 has been increased to approximately 1.2 times that of the comparative example.

By increasing the BTL gain preferably to at least about one, for example, it is possible to increase the both-end voltage $V_s$ of the piezoelectric vibrator 11 even if the detection voltage $V_{agc}$ is reduced without changing the drive voltage $V_{drv}$. Therefore, it is possible to increase the mechanical vibration amplitude of the piezoelectric vibrator 11, and thus, increase the sensitivity of the vibration gyro while reducing the drive voltage $V_{drv}$ so as to reduce the power supply voltage.

Next, limitations on the drive voltage $V_{drv}$ will be specifically described.

The power supply voltage of the vibration gyro 1 is limited. Also, in the AGC circuit 23, the voltage drops from an input power supply voltage $V_{cc}$ due to a transistor saturation voltage $V_{sat}$ of a drive amplifier. For example, assume that the input power supply voltage $V_{cc}$ of an oscillation circuit including the AGC circuit 23 is about 2.6 V and the sum $V_{sat}$ of the upper transistor saturation voltage and lower transistor saturation voltage is about 0.6 V. When the amplitude of the drive voltage $V_{drv}$ exceeds $V_{cc}-V_{sat}$=about 2.0 Vpp, the detection voltage is clipped and deformed. This causes a problem such as an oscillation stop, which prevents the vibration gyro from operating. Therefore, the drive voltage $V_{drv}$ must be reduced so that it falls within the dynamic range of the oscillation circuit including the AGC circuit 23.

Figure 6A:
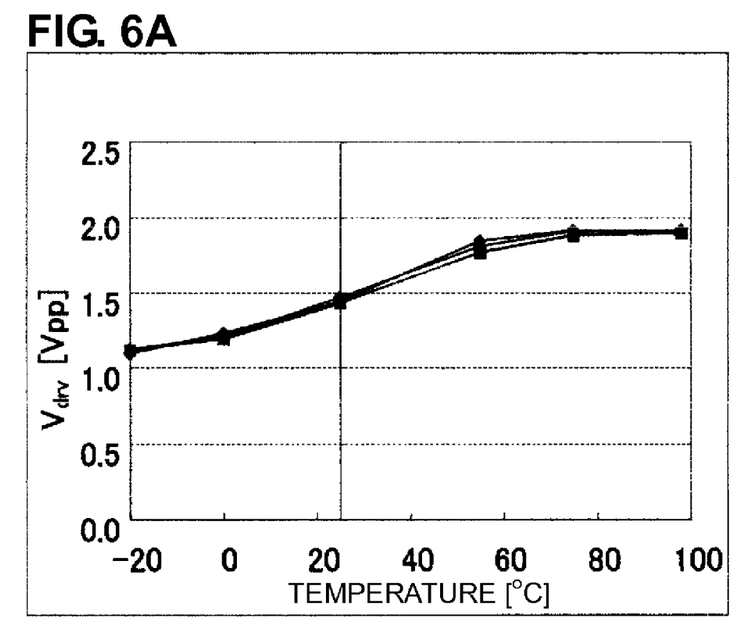
FIGS. 6A and 6B are graphs showing the influence of temperature characteristics of the piezoelectric vibrator.
Figure 6B:
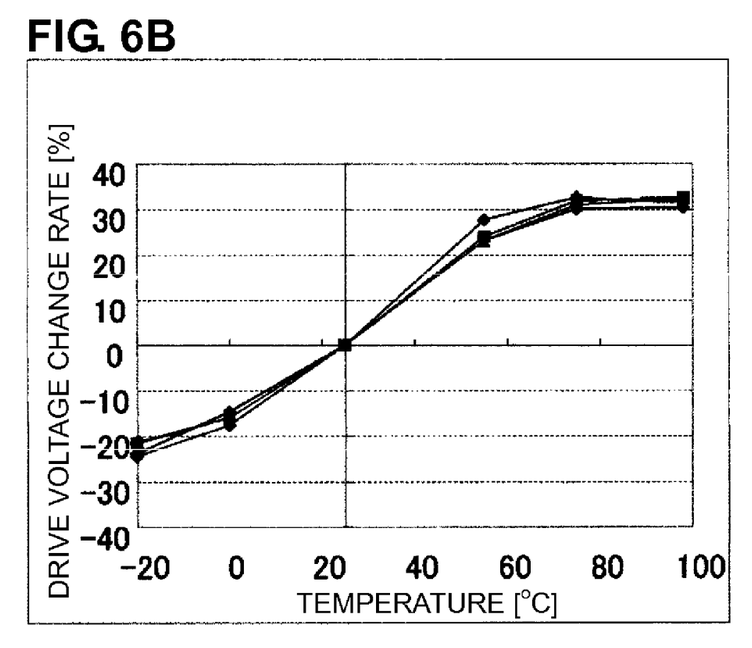

In addition, the drive resonant resistance Z of the piezoelectric vibrator has a temperature characteristic. The drive voltage $V_{drv}$ is influenced by the temperature characteristic and is changed. FIG. 6A is a graph showing an amplitude temperature characteristic of the drive voltage $V_{drv}$ of the piezoelectric vibrator. FIG. 6B is a graph showing the amplitude variation rate (the reference temperature is preferably 25° C., for example) of the drive voltage $V_{drv}$. For the shown piezoelectric vibrator, the amplitude of the drive voltage $V_{drv}$ is increased by about 30% at a temperature of about +75° C. as compared to that at a temperature of about +25° C., for example. Therefore, if the upper limit of the operating temperature of the piezoelectric vibrator is about 75° C., for example, the drive voltage $V_{drv}$ falls below about 2.0 Vpp and does not significantly deviate from the dynamic range of the AGC circuit 23 even at the upper limit temperature of about 75° C. if the drive voltage $V_{drv}$ at a room temperature of about 25° C. is set to approximately about 1.4 Vpp, for example, which is about a 30% reduction of about 2.0 Vpp.

By reducing the drive voltage $V_{drv}$ at room temperature, the drive voltage $V_{drv}$ is prevented from deviating from the dynamic range of the AGC circuit 23 even at higher temperatures. For that purpose, the drive voltage $V_{drv}$ at room temperature preferably satisfies the following formula:

$$V_{drv} \leq V'_{drv} = A_{drv} \times (V_{cc} + V_{sat}) \quad \text{Formula 11}$$

where $V'_{drv}$ [Vpp] is the design upper limit value of the drive voltage and $A_{drv}$ [times] is the amplitude variation ratio, which is the ratio of the room drive voltage to the largest drive voltage in the operating temperature range.

As shown, the drive voltage $V_{drv}$ is limited. Therefore, the circuit constant of the AGC circuit 23 or BTL gain $G_b$ is preferably set so that a drive voltage $V_{drv}$ preferably satisfying the above formula is realized.

The relationship between the detection voltage $V_{agc}$ and drive voltage $V_{drv}$ is preferably represented by the following formula.

$$V_{agc} = \frac{V_{drv} \times R_k}{(1+G_b) \times Z + R_k} \quad \text{Formula 12}$$

As described above, the drive voltage $V_{drv}$ is preferably less than the design upper value $V'_{drv}$, and thus, the AGC voltage $V_{agc}$ is preferably set so as to satisfy the following formula.

$$V_{agc} \leq \frac{V_{drv} \times R_k}{(1+G_b) \times Z + R_k} \quad \text{Formula 13}$$

In this case, the BTL gain $G_b$ is greater than about one, so the AGC voltage $V_{agc}$ preferably satisfies the following formula.

$$V_{agc} < \frac{V'_{drv} \times R_k}{2 \times Z + R_k} \quad \text{Formula 1}$$

If the circuit constant of the AGC circuit 23 is set and the automatic gain control is performed so that the detection voltage $V_{agc}$ preferably satisfies the above formula, a proper BTL gain $G_b$ is obtained. This enables the both-end voltage $V_s$ of the piezoelectric vibrator 11 to be greater than that in the case where BTL gain $G_b$=about 1 while preventing the drive voltage $V_{drv}$ from deviating from the dynamic range of the oscillation circuit including the AGC circuit 23. For example, in an example configuration of a voltage divider circuit where the detection voltage $V_{agc}$ is preferably about 0.7 Vpp and the drive voltage $V_{drv}$ is preferably about 1.4 Vpp when BTL gain $G_b$=about 1, if the circuit constant of the AGC circuit 23 is set so that the detection voltage $V_{agc}$ is less than about 0.7 Vpp, it is possible that the both-end voltage $V_s$ of the piezoelectric vibrator 11 will be greater than that in the case where BTL gain $G_b$=about 1 while reducing the drive voltage $V_{drv}$ to less than about 1.4 Vpp.

The AGC circuit 23 preferably includes a time constant circuit including a capacitor to smooth the detection voltage $V_{agc}$, and the detection voltage $V_{agc}$ is preferably set so that a smoothing error does not occur in the time constant circuit. If the detection voltage $V_{agc}$ is too small, it is difficult to detect the detection voltage $V_{agc}$ as an amplitude level. Therefore, the detection voltage $V_{agc}$ is preferably greater than about 0.3 Vpp, for example.

Next, the value of the gain $G_b$ that maximizes the both-end voltage $V_s$ of the piezoelectric vibrator 11 when the detection voltage $V_{agc}$ and the drive voltage $V_{drv}$ are determined will be described.

Figure 7A:
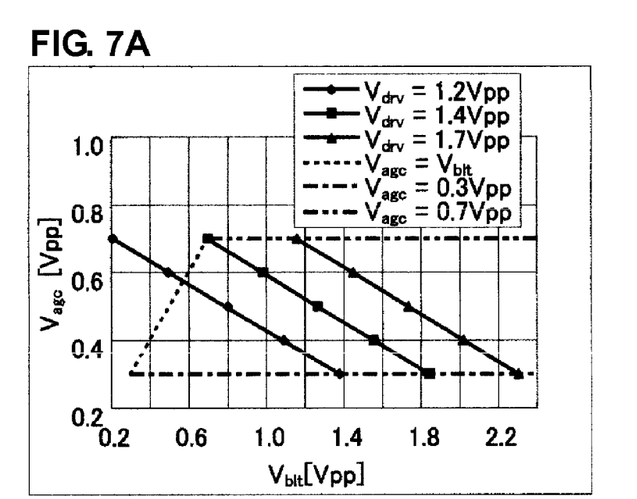
FIGS. 7A to 7C are graphs showing combinations of a detection voltage and a BLT voltage for realizing a predetermined drive voltage.

FIG. 7A is a graph obtained by plotting the combination of the amplitude of the BTL voltage $V_{btl}$ and that of the detection voltage $V_{agc}$ for each of set values of the drive voltage $V_{drv}$ in the above-mentioned example configuration of the voltage divider circuit. Solid lines in the graph show combinations of the amplitude of the BTL voltage $V_{btl}$ and that of the detection voltage $V_{agc}$ for providing drive voltages $V_{drv}$ about 1.2 Vpp, about 1.4 Vpp, and about 1.7 Vpp, for example.

The combination of the amplitude of the BTL voltage $V_{btl}$ and that of detection voltage $V_{agc}$, where the set value of the drive voltage $V_{drv}$ is preferably about 1.4 Vpp, for example, will be examined below.

Figure 7B:
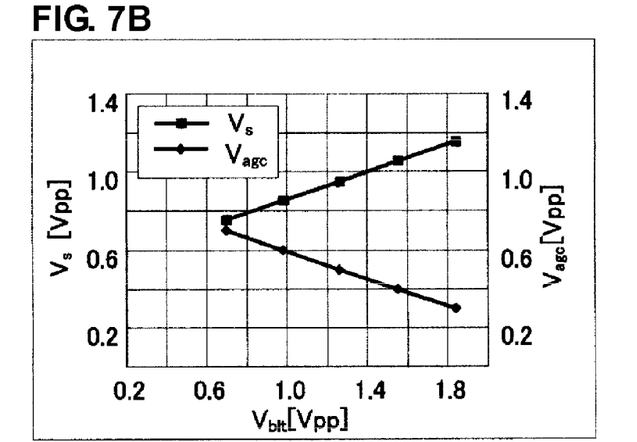

FIG. 7B is a graph obtained by plotting the combination of the set value of the BTL voltage $V_{btl}$ and that of the detection voltage $V_{agc}$ and the combination of the BTL voltage $V_{btl}$ and both-end voltage $V_s$ of the piezoelectric vibrator 11 where the set value of the drive voltage $V_{drv}$ is preferably about 1.4 Vpp, for example.

The both-end voltage $V_s$ of the piezoelectric vibrator 11 is obtained as the difference between the drive voltage $V_{drv}$ and detection voltage $V_{agc}$. Therefore, assuming that the drive voltage $V_{drv}$ is preferably about 1.4 Vpp, for example, if the detection voltage $V_{agc}$ is reduced, the difference between the detection voltage $V_{agc}$ and drive voltage $V_{drv}$ is increased. Thus, the both-end voltage $V_s$ of the piezoelectric vibrator 11 is increased. Therefore, the both-end voltage $V_s$ of the piezoelectric vibrator 11 is increased as the BTL voltage $V_{btl}$ is increased, that is, as the detection voltage $V_{agc}$ is decreased. Therefore, if the largest BTL voltage $V_{btl}$ and the smallest detection voltage $V_{agc}$ are combined, the both-end voltage $V_s$ of the piezoelectric vibrator 11 is maximized.

Figure 7C:
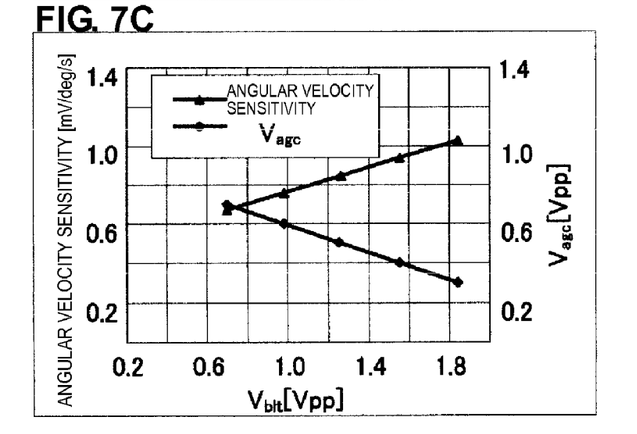

FIG. 7C is a graph obtained by plotting the relationship between the BTL voltage $V_{btl}$ and the angular velocity sensitivity of the vibration gyro 1 when the drive voltage $V_{drv}$ is preferably about 1.4 Vpp, for example.

The angular velocity sensitivity of the piezoelectric vibrator 11 is increased as the mechanical vibration amplitude of the piezoelectric vibrator 11 is increased. Also, the mechanical vibration amplitude of the piezoelectric vibrator 11 is increased as the both-end voltage $V_s$ of the piezoelectric vibrator 11 is increased. As described above, if the combination of the largest BTL voltage $V_{btl}$ and the smallest detection voltage $V_{agc}$ among the combinations for obtaining a predetermined drive voltage $V_{drv}$ are selected, the both-end voltage $V_s$ of the piezoelectric vibrator 11 is maximized. Therefore, the angular velocity sensitivity of the vibration gyro 1 is also maximized with this combination.

As described above, the detection voltage $V_{agc}$ preferably satisfies the following formula.

$$V_{agc} \leq \frac{V_{drv} \times R_k}{(1+G_b) \times Z + R_k} \quad \text{Formula 13}$$

By modifying this formula, the following formula is derived.

$$G_b \leq \frac{R_k}{Z} \times \left(\frac{V'_{drv}}{V_{agc}} - 1\right) - 1 \quad \text{Formula 3}$$

When the BTL gain $G_b$ is maximized, the BTL voltage $V_{btl}$ is maximized. That is, when the BTL gain $G_b$ satisfies the following formula, the BTL voltage $V_{btl}$ is maximized, the detection voltage $V_{agc}$ is minimized, the both-end voltage $V_s$ of the piezoelectric vibrator 11 is maximized, and the angular velocity sensitivity of the vibration gyro 1 is maximized.

$$\begin{aligned}G_b &\cong \frac{R_k}{Z} \times \left(\frac{V'_{drv}}{V_{agc}} - 1\right) - 1 \quad \text{Formula 14}\\ &= \frac{R_k}{Z} \times \left(\frac{A_{drv} \times (V_{cc} - V_{sat})}{V_{agc}} - 1\right) - 1\end{aligned}$$

By setting the BTL gain $G_b$ as shown in the above formula, it is possible to maximize the both-end voltage $V_s$ or mechanical vibration amplitude of the piezoelectric vibrator 11 and maximize the sensitivity of the vibration gyro 1 while reducing the drive voltage $V_{drv}$ to the design upper limit value $V'_{drv}$ or less with respect to an arbitrary detection voltage $V_{agc}$.

For example, if the $V_{agc}$ is set to about 0.5 [Vpp] when Z=about 35 [kΩ], $R_k$=about 65 [kΩ], $A_{drv}$=about 0.7 [times], $V_{sat}$=about 0.6 [V], $V_{cc}$=about 2.6 [V], it is possible to maximize the both-end voltage $V_s$ or the mechanical vibration amplitude of the piezoelectric vibrator 11 and to maximize the sensitivity of the vibration gyro 1 when $G_b$=about 2.34 while reducing the drive voltage $V_{drv}$ to the design upper limit value $V'_{drv}$ [Vpp] or less.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A vibration gyro comprising:
a piezoelectric vibration unit including a drive electrode and first and second detection electrodes, the piezoelectric vibration unit being arranged to vibrate in response to a drive voltage input into the drive electrode, and when deformed by a Coriolis force, to generate detection voltages at the first and second detection electrodes, the detection voltages being voltages having a potential difference corresponding to the deformation;
an addition circuit arranged to add the detection voltages of the first and second detection electrodes;
an automatic gain control circuit arranged to output the drive voltage while performing automatic gain control so that an output voltage of the addition circuit has a given amplitude;
a balanced transformerless circuit arranged to output a voltage to the first and second detection electrodes via a detection resistance in a phase obtained by inverting an output voltage of the addition circuit, the voltage having an amplitude greater than amplitudes of the detection voltages; and
a detection circuit arranged to detect the potential difference from the detection voltages of the first and second detection electrodes; wherein
a circuit constant of the automatic gain control circuit is set so that $$V_{agc} < \frac{V'_{drv} \times R_k}{2 \times Z + R_k},$$

where $V_{agc}$ is the amplitude of each of the detection voltages, $V'_{drv}$ is a design upper limit value of the drive voltage, $R_k$ is the detection resistance, which includes two parallel resistances, and Z is a drive resonant resistance of the piezoelectric vibration unit.

2. The vibration gyro according to claim 1, wherein the design upper limit value $V'_{drv}$ of the drive voltage is determined by $V'_{drv} = A_{drv} \times (V_{cc} - V_{sat})$ where $A_{drv}$ is a ratio of a value of the drive voltage at room temperature to a maximum value of the drive voltage in an operating temperature range, $V_{cc}$ is an input power supply voltage of the automatic gain control circuit, $V_{sat}$ is a drive amplifier saturation voltage of the automatic gain control circuit, and the drive amplifier saturation voltage includes upper and lower drive amplifier saturation voltages.

3. The vibration gyro according to claim 1, wherein for the balanced transformerless circuit, a gain $G_b$ of an output voltage with respect to the detection voltage is determined by $$G_b \leq \frac{R_k}{Z} \times \left(\frac{V'_{drv}}{V_{agc}} - 1\right) - 1.$$

4. The vibration gyro according to claim 3, wherein the gain $G_b$ satisfies $$G_b \cong \frac{R_k}{Z} \times \left(\frac{V'_{drv}}{V_{agc}} - 1\right) - 1.$$

5. The vibration gyro according to claim 1, wherein the automatic gain control circuit includes a time constant circuit arranged to smooth an output voltage of the addition circuit, and a circuit constant of the automatic gain control circuit is set so that an amplitude of an output voltage of the addition circuit is greater than an amplitude that causes a smoothing error in the time constant circuit.

* * * * *